United States Patent
Omiya et al.

(10) Patent No.: US 8,643,235 B2
(45) Date of Patent: Feb. 4, 2014

(54) DRIVE DEVICE FOR VEHICLE

(75) Inventors: Yuji Omiya, Toyota (JP); Masaki Yoshino, Toyota (JP); Yutaka Hotta, Chiryu (JP)

(73) Assignees: Toyota Jidosha Kabushiki Kaisha, Aichi-ken (JP); Aisin AW Co., Ltd., Aichi-ken (JP)

( * ) Notice: Subject to any disclaimer, the term of this patent is extended or adjusted under 35 U.S.C. 154(b) by 720 days.

(21) Appl. No.: 12/743,297

(22) PCT Filed: Dec. 2, 2008

(86) PCT No.: PCT/JP2008/071880
§ 371 (c)(1),
(2), (4) Date: May 17, 2010

(87) PCT Pub. No.: WO2009/072491
PCT Pub. Date: Jun. 11, 2009

(65) Prior Publication Data
US 2010/0283337 A1    Nov. 11, 2010

(30) Foreign Application Priority Data
Dec. 5, 2007 (JP) ................................. 2007-314845

(51) Int. Cl.
*H02K 9/22* (2006.01)
*B60K 6/20* (2007.10)

(52) U.S. Cl.
USPC ............ 310/64; 310/75 R; 310/58; 180/65.21

(58) Field of Classification Search
USPC ............. 310/64, 75 R, 58, 54, 52; 180/65.21; 903/906, 951–952
See application file for complete search history.

(56) References Cited

U.S. PATENT DOCUMENTS

| | | | |
|---|---|---|---|
| 5,825,107 A * | 10/1998 | Johnson et al. ................ | 310/64 |
| 7,932,624 B2 * | 4/2011 | Yoshida ........................ | 307/9.1 |
| 2002/0094898 A1 | 7/2002 | Hata et al. | |
| 2003/0173839 A1 * | 9/2003 | Torii et al. ....................... | 310/52 |

(Continued)

FOREIGN PATENT DOCUMENTS

| CN | 1772523 A | 5/2006 |
|---|---|---|
| CN | 1949655 A | 4/2007 |

(Continued)

OTHER PUBLICATIONS

Chinese Office Action issued in corresponding Chinese Application No. 200880119053.8 dated Jun. 26, 2012.

*Primary Examiner* — Tran Nguyen
*Assistant Examiner* — Leda Pham
(74) *Attorney, Agent, or Firm* — Sughrue Mion, PLLC (57) ABSTRACT

A drive device for a vehicle includes a motor generator generating drive force, and a power control unit provided integrally with the motor generator for controlling the motor generator. The includes a low-voltage circuit section to which a relatively low voltage is applied, a high-voltage circuit section which is located at a rear side of the vehicle relative to the low-voltage circuit section and to which a relatively high voltage is applied, and a cooling plate located between the low-voltage circuit section and the high-voltage circuit section in a longitudinal direction of the vehicle for cooling the high-voltage circuit section. With such configuration, the drive device for a vehicle allows the power control unit to be protected appropriately against an externally imposed shock.

6 Claims, 4 Drawing Sheets

(56) References Cited

U.S. PATENT DOCUMENTS

| | | |
|---|---|---|
| 2006/0097670 A1 | 5/2006 | Fukasaku et al. |
| 2008/0067973 A1 | 3/2008 | Ishikawa et al. |
| 2009/0015185 A1 | 1/2009 | Yoshida |
| 2009/0218970 A1 | 9/2009 | Lei |

FOREIGN PATENT DOCUMENTS

| | | | | |
|---|---|---|---|---|
| CN | 1993879 A | | 7/2007 | |
| JP | 6-303704 A | | 10/1994 | |
| JP | 2001-119898 A | | 4/2001 | |
| JP | 2002-274201 A | | 9/2002 | |
| JP | 2003-45392 A | | 2/2003 | |
| JP | 2003-199363 A | | 7/2003 | |
| JP | 2004-343845 A | | 12/2004 | |
| JP | 2005-333747 A | | 12/2005 | |
| JP | 2005333747 A | * | 12/2005 | ............. B60L 11/14 |
| JP | 2007-99121 A | | 4/2007 | |
| JP | 2007-220976 A | | 8/2007 | |
| WO | WO 2007094508 A1 | * | 8/2007 | |

* cited by examiner

DRIVE DEVICE FOR VEHICLE

TECHNICAL FIELD

The present invention generally relates to a drive device for a vehicle, and more particularly to a drive device for a vehicle in which a rotating electric machine and a power control unit controlling the rotating electric machine are integrated with each other.

BACKGROUND ART

Relating to conventional vehicle drive devices, Japanese Patent Laying-Open No. 2005-333747, for example, discloses an inverter-integrated rotating electric machine directed to facilitate removal of air in a coolant channel (Patent Document 1). According to Patent Document 1, a power control unit (PCU) is mounted on a motor generator serving as a rotating electric machine, with the motor generator and the power control unit integrated with each other.

Japanese Patent Laying-Open No. 2001-119898 discloses a drive device directed to integrate an inverter case into a drive-device case to improve the mountability on a vehicle (Patent Document 2). According to Patent Document 2, the inverter case is provided integrally over the drive-device case. The inverter case stores a heat sink, inverters for a drive motor and a generator motor, a smoothing capacitor, and a control substrate.

Japanese Patent Laying-Open No. 2004-343845 discloses an electric-motor-integrated drive device with a plurality of electric motors integrated into individual case portions, respectively, the drive device being directed to achieve both of integration of the inverters corresponding to the respective electric motors into the drive device and cooling of the inverters (Patent Document 3). According to Patent Document 3, inverter cases are attached to a drive-device case. Japanese Patent Laying-Open No. 2007-99121 discloses a drive device for a hybrid vehicle directed to integrate and downsize inverters (Patent Document 4). According to Patent Document 4, motor generators, a power split mechanism and a power control unit are stored in and integrated with a metal case.

Japanese Patent Laying-Open No. 2003-199363 discloses a control unit for an electric drive device directed to achieve favorable compactness, ease of assembling, productivity, and resistance to vibration (Patent Document 5). According to Patent Document 5, the control unit is attached, in a leaning forward state, to a drive-device case in front of the drive device. Power modules constituting the control unit are arranged in contact with a heat sink implemented by a bottom wall of the case. Capacitors for a smoothing circuit of an inverter are located above the power modules, and a control substrate is located thereabove.

Japanese Patent Laying-Open No. 2002-274201 discloses a power transfer device directed to minimize space for mounting a generator and a motor in a direction perpendicular to a rotation shaft of the generator and an output shaft of the motor (Patent Document 6). In the power transfer device disclosed in Patent Document 6, the rotation shaft of a first motor generator and that of a second motor generator are offset in their radial direction.

Patent Document 1: Japanese Patent Laying-Open No. 2005-333747
Patent Document 2: Japanese Patent Laying-Open No. 2001-119898
Patent Document 3: Japanese Patent Laying-Open No. 2004-343845
Patent Document 4: Japanese Patent Laying-Open No. 2007-99121
Patent Document 5: Japanese Patent Laying-Open No. 2003-199363
Patent Document 6: Japanese Patent Laying-Open No. 2002-274201

DISCLOSURE OF THE INVENTION

Problems to be Solved by the Invention

According to the aforementioned Patent Document 1, the motor generator with which the power control unit is provided integrally is stored in an engine compartment located at the front side of the vehicle. Since the power control unit includes high-voltage circuit sections such as an inverter that converts between a DC voltage and an AC voltage between a battery and the motor generator, and a converter that boosts and down-converts a voltage, sufficient consideration needs to be given to the shock imposed at the front side of the vehicle on the power control unit.

Therefore, an object of the present invention is to solve the above-described problem and to provide a drive device for a vehicle in which the power control unit is protected appropriately against an externally imposed shock.

Means for Solving the Problems

A drive device for a vehicle according to the present invention includes a rotating electric machine generating drive force, and a power control unit provided integrally with the rotating electric machine for controlling the rotating electric machine. The power control unit includes a low-voltage circuit section to which a relatively low voltage is applied, a high-voltage circuit section which is located at a rear side of the vehicle relative to the low-voltage circuit section and to which a relatively high voltage is applied, and a cooling plate located between the low-voltage circuit section and the high-voltage circuit section in a longitudinal direction of the vehicle for cooling the high-voltage circuit section.

According to the drive device for a vehicle having such configuration, when shock is imposed on the drive device for a vehicle at the front side of the vehicle, the shock is absorbed by the low-voltage circuit section, and the strength of the high-voltage circuit section at the front side of the vehicle can be improved through the use of the cooling plate. Accordingly, shock reaching the high-voltage circuit section to which a high voltage is applied can be reduced, and the power control unit can be protected appropriately.

Preferably, the drive device for a vehicle further includes a case body storing the rotating electric machine. The cooling plate is made of metal and fixed to the case body. According to the drive device for a vehicle having such configuration, the strength of the high-voltage circuit section at the front side of the vehicle can be improved through the use of the cooling plate firmly supported by the case body.

Preferably, the drive device for a vehicle further includes a case body storing the rotating electric machine and being made of metal. The case body includes a tubular portion having a tubular shape extending in the longitudinal direction of the vehicle, and storing the power control unit in the tubular shape. The cooling plate and the high-voltage circuit section are located at the rear side of the vehicle relative to an opening plane where the tubular portion is open toward a front side of the vehicle. According to the drive device for a vehicle having such configuration, the strength of the high-voltage circuit section at the front side of the vehicle can be improved through the use of the tubular portion storing the power control unit.

Preferably, a first rotating electric machine and a second rotating electric machine controlled by the power control unit to execute different operations are provided as the rotating electric machine. The first rotating electric machine and the second rotating electric machine are located such that a rotation axis of the second rotating electric machine is offset to the rear side of the vehicle relative to a rotation axis of the first rotating electric machine. The power control unit is located at a front side of the vehicle relative to the second rotating electric machine. According to the drive device for a vehicle having such configuration, offsetting the rotation axis of the second rotating electric machine to the rear side of the vehicle relative to the rotation axis of the first rotating electric machine can ensure space at the front side of the vehicle relative to the second rotating electric machine. Locating the power control unit in this space allows the drive device for a vehicle to be formed compact, and can provide the first rotating electric machine with a section that absorbs shock imposed at the front side of the vehicle.

Preferably, the drive device for a vehicle further includes a first case body storing the first rotating electric machine, and a second case body storing the second rotating electric machine and the power control unit. The second case body is arranged adjacent to the first case body in a lateral direction of the vehicle, and coupled to the first case body. The cooling plate and the high-voltage circuit section are located at the rear side of the vehicle relative to a leading edge of the first case body in the longitudinal direction of the vehicle. According to the drive device for a vehicle having such configuration, shock imposed at the front side of the vehicle can be absorbed by the first case body.

Preferably, the high-voltage circuit section includes an inverter converting between a DC voltage and an AC voltage between the rotating electric machine and a battery, and a converter boosting and down-converting a voltage. The low-voltage circuit section includes a controller sending control signals to the inverter and the converter. According to the drive device for a vehicle having such configuration, the high-voltage circuit section in which a high-voltage current for driving the vehicle flows can be appropriately protected against shock imposed from outside the vehicle.

Preferably, the rotating electric machine and the power control unit are placed in an engine compartment located at a front side of the vehicle. According to the drive device for a vehicle having such configuration, the power control unit can be appropriately protected even when the engine compartment is deformed in the event of a vehicle crash.

Effects of the Invention

As described above, according to the present invention, a drive device for a vehicle in which a power control unit is protected appropriately against an externally imposed shock can be provided.

DESCRIPTION OF THE REFERENCE SIGNS 20 vehicle drive device; 21 power control unit (PCU); 51 engine compartment; 61 MG1 case; 61f leading edge; 63 tubular portion; 63p opening plane; 64 MG2/inverter case; 71 low-voltage circuit section; 72 cooling plate; 75 high-voltage circuit section; 101, 102 rotation axis; MG1, MG2 motor generator

BEST MODES FOR CARRYING OUT THE INVENTION

Embodiments of the present invention will be described below with reference to the drawings. In the following description, the same parts are given the same reference numerals. Names and functions thereof are all the same.

Figure 1:
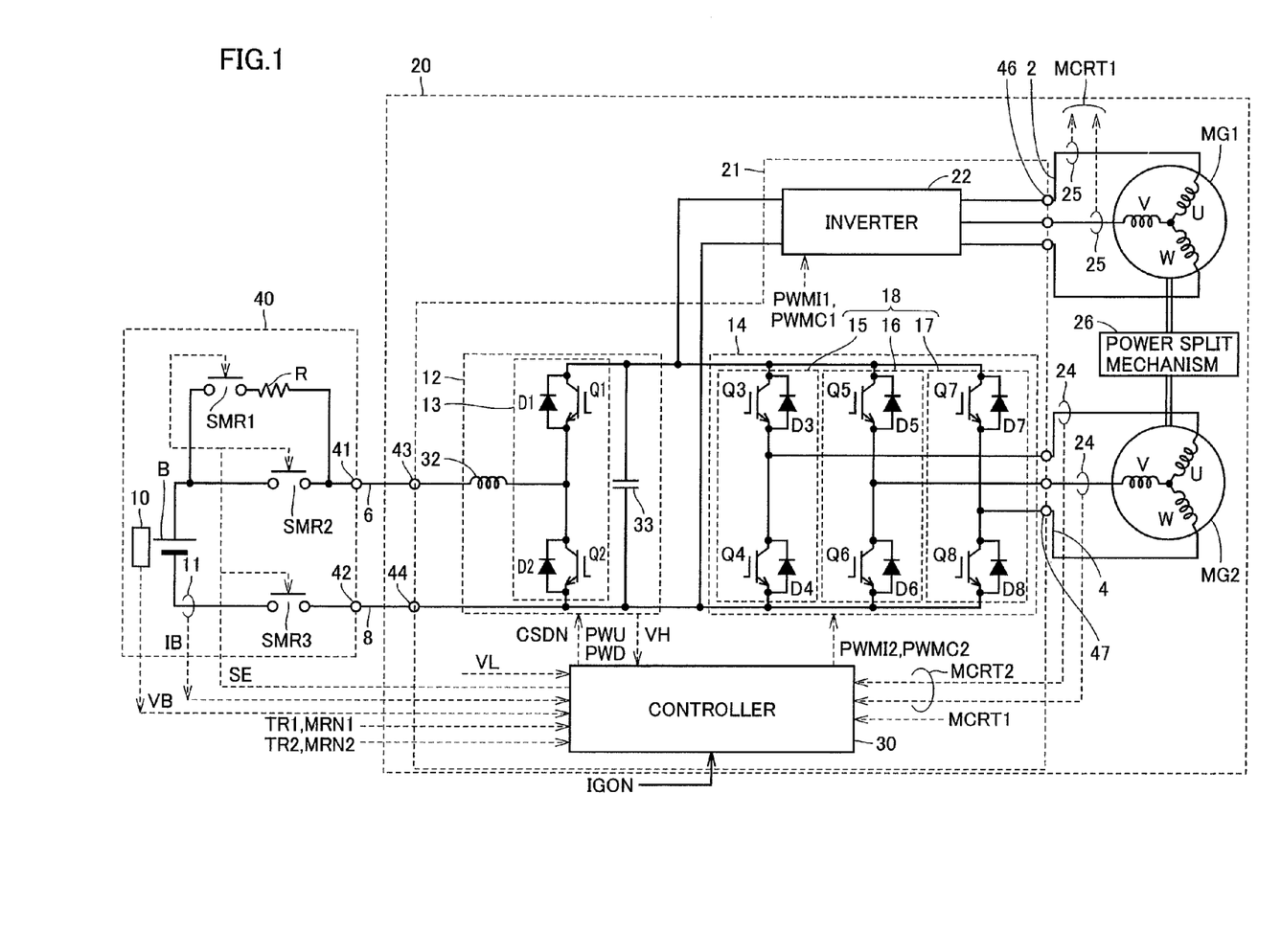
FIG. 1 is a circuit diagram showing a configuration related to motor generator control of a hybrid vehicle.

FIG. 1 is a circuit diagram showing a configuration related to motor generator control of a hybrid vehicle. The hybrid vehicle includes, as driving sources, an internal combustion engine such as a gasoline engine or a diesel engine and a motor supplied with electric power from a chargeable and dischargeable secondary cell (battery).

With reference to FIG. 1, the hybrid vehicle includes a battery unit 40, a vehicle drive device 20 and an engine not shown. Vehicle drive device 20 includes motor generators M1, M2 serving as a motor and a generator, a power split mechanism 26 distributing motive power among the engine not shown, motor generators M1 and M2, and a power control unit (PCU) 21 controlling motor generators M1 and M2.

Battery unit 40 has terminals 41 and 42. PCU 21 has DC terminals 43 and 44. Terminal 41 and DC terminal 43 are electrically connected with a cable 6, and terminal 42 and DC terminal 44 are electrically connected with a cable 8. PCU 21 has MG terminals 46 and 47. U-, V- and W-phase coils of motor generator MG1 are electrically connected to MG terminal 46 with a cable 2. U-, V- and W-phase coils of motor generator MG2 are electrically connected to MG terminal 47 with a cable 4.

Battery unit 40 includes a battery B, a system main relay SMR2 connected between a positive electrode of battery B and terminal 41, a system main relay SMR3 connected between a negative terminal of battery B and terminal 42, and a system main relay SMR1 and a limiting resistor R connected in series between the positive electrode of battery B and terminal 41. System main relays SMR1 to SMR3 are controlled to take a conducting/non-conducting state in accordance with a control signal SE received from a controller 30 which will be described later.

Battery unit 40 includes a voltage sensor 10 measuring a voltage VB between the terminals of battery B, and a current sensor 11 detecting a current IB flowing through battery B. Battery B can be implemented by a nickel-metal hydride, lithium ion or similar secondary battery, a fuel cell or the like. A large-capacitance capacitor such as an electric double-layer capacitor can be used as a power storage device instead of battery B.

PCU 21 includes inverters 22, 14 provided in correspondence with motor generators MG1, MG2, respectively, a boost converter 12 provided in common for inverters 14 and 22, and controller 30.

Boost converter 12 boosts the voltage between DC terminals 43 and 44. Boost converter 12 includes a reactor 32 having one end connected to terminal 43, a boosting IPM (Intelligent Power Module) 13, and a smoothing capacitor 33. Boosting IPM 13 includes IGBT elements Q1, Q2 connected in series between output terminals of boost converter 12 which outputs boosted voltage VH, and diodes D1, D2 connected in parallel with IGBT elements Q1, Q2, respectively. Smoothing capacitor 33 smoothes the voltage boosted by boost converter 12.

Reactor 32 has the other end connected to the emitter of IGBT element Q1 and the collector of IGBT element Q2. Diode D1 has its cathode connected to the collector of IGBT element Q1, and has its anode connected to the emitter of IGBT element Q1. Diode D2 has its cathode connected to the collector of IGBT element Q2, and has its anode connected to the emitter of IGBT element Q2.

Inverter 14 converts the DC voltage received from boost converter 12 into three-phase AC for output to motor generator MG2 which drives the wheels. Inverter 14 returns the power generated at motor generator MG2 in accordance with regenerative braking, to boost converter 12. At this stage, boost converter 12 is controlled by controller 30 so as to operate as a down-converting circuit.

Inverter 14 includes a U-phase arm 15, a V-phase arm 16 and a W-phase arm 17 constituting a running IPM 18. U-phase arm 15, V-phase arm 16 and W-phase arm 17 are connected in parallel between output lines of boost converter 12.

U-phase arm 15 includes IGBT elements Q3, Q4 connected in series, and diodes D3, D4 connected in parallel with IGBT elements Q3, Q4, respectively. Diode D3 has its cathode connected to the collector of IGBT element Q3, and has its anode connected to the emitter of IGBT element Q3. Diode D4 has its cathode connected to the collector of IGBT element Q4, and has its anode connected to the emitter of IGBT element Q4.

V-phase arm 16 includes IGBT elements Q5, Q6 connected in series, and diodes D5, D6 connected in parallel with IGBT elements Q5, Q6, respectively. Diode D5 has its cathode connected to the collector of IGBT element Q5, and has its anode connected to the emitter of IGBT element Q5. Diode D6 has its cathode connected to the collector of IGBT element Q6, and has its anode connected to the emitter of IGBT element Q6.

W-phase arm 17 includes IGBT elements Q7, Q8 connected in series, and diodes D7, D8 connected in parallel with IGBT elements Q7, Q8, respectively. Diode D7 has its cathode connected to the collector of IGBT element Q7, and has its anode connected to the emitter of IGBT element Q7. Diode D8 has its cathode connected to the collector of IGBT element Q8, and has its anode connected to the emitter of IGBT element Q8.

An intermediate point of each phase arm is connected to the phase end of each phase coil of motor generator MG2. More specifically, motor generator MG2 is a three-phase permanent magnet synchronous motor, and one ends of the three coils, i.e., U-, V- and W-phase coils, are connected to a neutral point. The other end of the U-phase coil is connected to a connection node of power transistor elements Q3 and Q4. The other end of the V-phase coil is connected to a connection node of IGBT elements Q5 and Q6. The other end of the U-phase coil is connected to a connection node of IGBT elements Q7 and Q8.

Current sensor 25 detects the current flowing through motor generator MG1 as a motor current value MCRT1, and outputs motor current value MCRT1 to controller 30. Current sensor 24 detects the current flowing through motor generator MG2 as a motor current value MCRT2, and outputs motor current value MCRT2 to controller 30.

Inverter 22 is connected to boost converter 12 in parallel with inverter 14. Inverter 22 converts the DC voltage received from boost converter 12 into three-phase AC for output to motor generator MG1. Upon receipt of the boosted voltage from boost converter 12, inverter 22 drives motor generator MG1 for starting the engine, for example.

Inverter 22 returns the electric power generated at motor generator MG1 by rotation torque transmitted from the crankshaft of the engine, to boost converter 12. At this stage, boost converter 12 is controlled by controller 30 so as to operate as a down-converting circuit. The internal configuration of inverter 22 is similar to that of inverter 14, and detailed description thereof is not repeated.

Controller 30 receives torque command values TR1, TR2, respective values of motor speed MRN1, MRN2, voltages VB, VL, VH and current IB, motor current values MCRT1, MCRT2 and an activation signal IGON.

Herein, torque command value TR1, motor speed MRN1 and motor current value MCRT1 relate to motor generator MG1, while torque command value TR2, motor speed MRN2 and motor current value MCRT2 relate to motor generator MG2. Voltage VB is a voltage of battery B, and current IB is a current flowing through battery B. Voltage VL is a voltage of boost converter 12 before being boosted, and voltage VH is a voltage of boost converter 12 after being boosted.

Controller 30 outputs, to boost converter 12, a control signal PWU giving a boost instruction, a control signal PWD giving a down-conversion instruction, and a signal CSDN instructing prohibition of operation.

Controller 30 outputs, to inverter 14, a drive instruction PWMI2 causing a DC voltage output from boost converter 12 to be converted into an AC voltage for driving motor generator MG2, and a regeneration instruction PWMC2 causing an AC voltage generated at motor generator MG2 to be converted into a DC voltage and to be returned to boost converter 12. Controller 30 outputs, to inverter 22, a drive instruction PWMI1 causing a DC voltage to be converted into an AC voltage for driving motor generator MG1, and a regeneration instruction PWMC1 causing an AC voltage generated at motor generator MG1 to be converted into a DC voltage and to be returned to boost converter 12.

Figure 2:
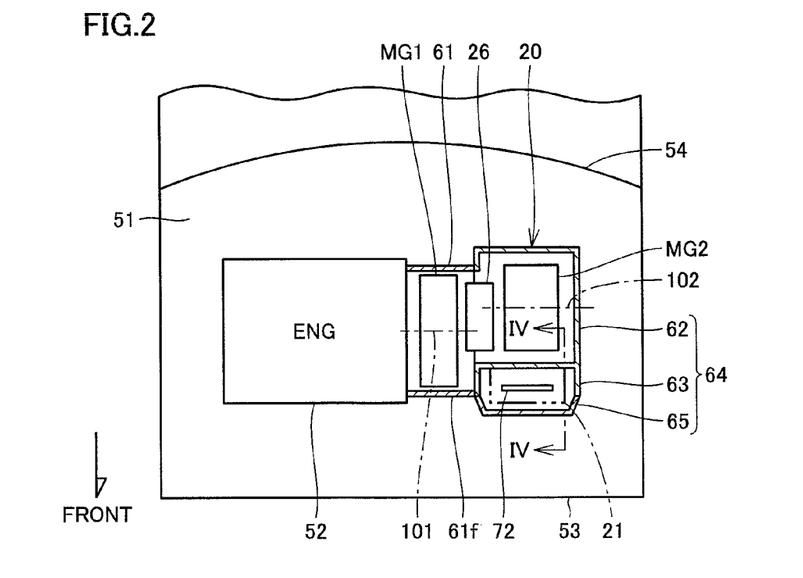
FIG. 2 is a plan view showing an engine compartment of the hybrid vehicle.

Next, a configuration of vehicle drive device 20 shown in FIG. 1 will be described in detail. FIG. 2 is a plan view showing the engine compartment of the hybrid vehicle.

With reference to FIG. 2, an engine compartment 51 in which an engine 52 is mounted is provided at the front side of the vehicle. Engine compartment 51 is formed between a front bumper 53 and a dashboard panel 54. Dashboard panel 54 is a panel that separates engine compartment 51 and the vehicle interior.

Vehicle drive device 20 is stored in engine compartment 51. Vehicle drive device 20 is arranged adjacent to engine 52 in the lateral direction of the vehicle. Motor generator MG1 serving as a first rotating electric machine is located at a position adjacent to engine 52. Motor generator MG2 serving as a second rotating electric machine is located at the opposite side of engine 52 relative to motor generator MG1. Engine 52, motor generator MG1 and motor generator MG2 are arranged in the lateral direction of the vehicle. Power split mechanism 26 is located between motor generators MG1 and MG2.

Axes about which motor generators MG1 and MG2 rotate are denoted by rotations axes 101 and 102, respectively. Rotations axes 101 and 102 extend in parallel with each other in the lateral direction of the vehicle. Motor generator MG1 is arranged such that rotation axis 101 is coaxial with the crankshaft of engine 52. Motor generator MG2 is positioned relative to motor generator MG1 such that rotation axis 102 is offset to the rear side of the vehicle relative to rotation axis 101.

The above-described configuration ensures space at the front side of the vehicle relative to motor generator MG2. Locating PCU 21 in this space allows size reduction of vehicle drive device 20. PCU 21 is arranged adjacent to motor generator MG2 in the horizontal direction. In this case, the center of gravity of vehicle drive device 20 can be lowered as compared to the case of arranging PCU 21 above motor generator MG2. Accordingly, the hybrid vehicle can be improved in the vibration characteristic and riding comfort.

Figure 3:
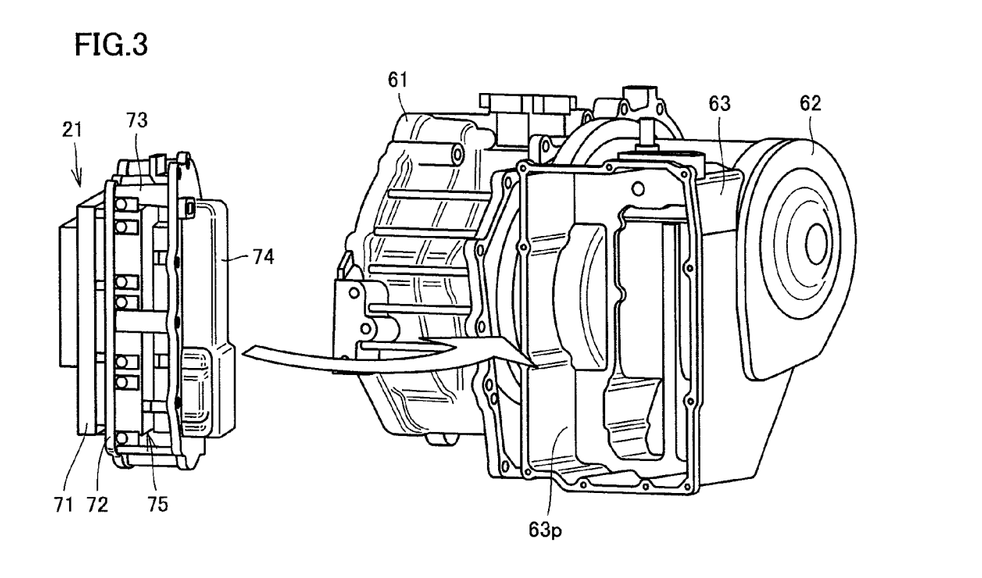
FIG. 3 is a perspective view showing a power control unit shown in FIG. 2.

FIG. 3 is a perspective view showing the power control unit shown in FIG. 2. With reference to FIGS. 2 and 3, vehicle drive device 20 includes an MG1 case 61 storing motor generator MG1, and an MG2/inverter case 64 storing motor generator MG2 and PCU 21. MG1 case 61 and MG2/inverter case 64 are made of metal such as aluminum.

MG1 case 61 has a tubular shape extending from engine 52 in the lateral direction of the vehicle. MG2/inverter case 64 includes an MG2 storing portion 62 storing motor generator MG2, a tubular portion 63 and a lid 65, with which PCU 21 is enclosed. MG2 storing portion 62 has a tubular shape extending from MG1 case 61 in the lateral direction of the vehicle and closed at an end of extension. MG2 storing portion 62 is arranged adjacent to MG1 case 61 in the lateral direction of the vehicle, and coupled to MG1 case 61. Tubular portion 63 has a tubular shape extending from MG2 storing portion 62 toward the front side of the vehicle. At an end of the tubular extension, tubular portion 63 has an opening plane 63*p* which is open toward the front side of the vehicle. Lid 65 is attached to tubular portion 63 so as to close opening plane 63*p*.

While MG2 storing portion 62 and tubular portion 63 are integrated with each other in the present embodiment, this is not a limitative example. MG2 storing portion 62 and tubular portion 63 may be configured separately, and tubular portion 63 may be coupled to MG2 storing portion 62.

Figure 4:
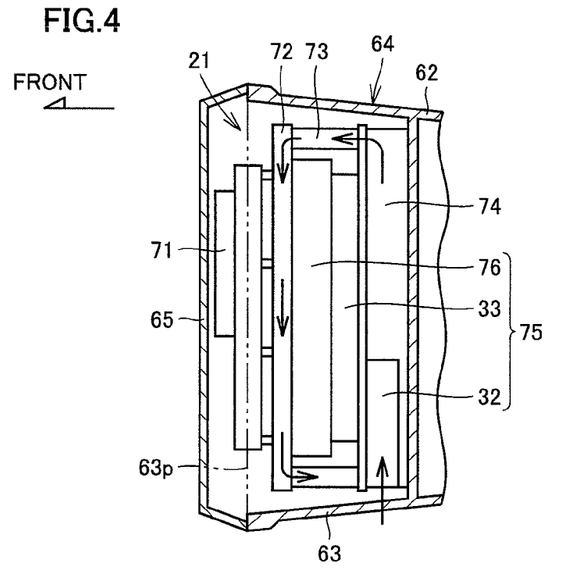
FIG. 4 is a sectional view of the power control unit taken along the line IV-IV of FIG. 2.

FIG. 4 is a sectional view of the power control unit taken along the line IV-IV of FIG. 2. With reference to FIGS. 1 to 4, PCU 21 includes a low-voltage circuit section 71 to which a relatively low voltage is applied, and a high-voltage circuit section 75 to which a relatively high voltage is applied.

Low-voltage circuit section 71 corresponds to a control substrate of controller 30. In addition to battery B, the hybrid vehicle is equipped with an auxiliary battery (12V) as a second battery having a smaller capacity than battery B. Low-voltage circuit section 71 is operated by the voltage supplied from this auxiliary battery. High-voltage circuit section 75 includes an IPM 76, smoothing capacitor 33 and reactor 32. IPM 76 is formed by running IPM 18 and boosting IPM 13 respectively constituting inverters 14, 22 and boost converter 12 shown in FIG. 1. Current for driving the vehicle flows through high-voltage circuit section 75. As an example, the current boosted by boost converter 12 has a voltage higher than or equal to 450V. The current boosted by boost converter 12 may have a voltage higher than or equal to 650V. The current supplied from battery B to boost converter 12 has a voltage of higher than or equal to 200V.

With reference to FIG. 4, PCU 21 includes a cooling plate 72, a water jacket 74 and a coupling member 73. Cooling plate 72 has a plate-like shape. Cooling plate 72 is arranged to extend as a plate within a plane perpendicular to the longitudinal direction of the vehicle. Cooling plate 72, water jacket 74 and coupling member 73 are made of metal such as aluminum. Water jacket 74 is located at a position spaced apart from cooling plate 72 toward the rear side of the vehicle.

Water jacket 74 is fixed to MG2/inverter case 64. Coupling member 73 extends in the longitudinal direction of the vehicle, and couples cooling plate 72 and water jacket 74. With this configuration, cooling plate 72 is fixed to MG2/inverter case 64 with coupling member 73 and water jacket 74 interposed therebetween. It should be noted that cooling plate 72 may be fixed directly to tubular portion 63.

Low-voltage circuit section 71 is located at the front side of the vehicle relative to cooling plate 72. Low-voltage circuit section 71 is arranged to be enclosed by tubular portion 63 and lid 65. High-voltage circuit section 75 is located at the rear side of the vehicle relative to cooling plate 72. More specifically, IPM 76 is arranged to be in contact with cooling plate 72. Smoothing capacitor 33 is located at the opposite side of cooling plate 72 relative to IPM 76. IPM 76 and smoothing capacitor 33 are located in the space between cooling plate 72 and water jacket 74. Water jacket 74 and reactor 32 are located in an overlapping relationship in the longitudinal direction of the vehicle. IPM 76, smoothing capacitor 33 and reactor 32 are arranged so as to be projected onto a surface of cooling plate 72 as viewed in the longitudinal direction of the vehicle. Low-voltage circuit section 71, cooling plate 72, IPM 76, smoothing capacitor 33, and reactor 32 are aligned in the horizontal direction. Low-voltage circuit section 71, cooling plate 72, IPM 76, smoothing capacitor 33, and reactor 32 are aligned in the longitudinal direction of the vehicle.

Cooling plate 72 and high-voltage circuit section 75 are located at the rear side of the vehicle relative to the opening plane 63*p* of MG2/inverter case 64 serving as a case body. Cooling plate 72 and high-voltage circuit section 75 stored in MG2/inverter case 64 serving as a second case body are located at the rear side of the vehicle relative to a leading edge 61*f* of MG1 case 61 serving as a first case body (cf. FIG. 1).

A coolant passage is formed in cooling plate 72, water jacket 74 and coupling member 73, and a coolant flows through the respective members. With such configuration, cooling plate 72 serves to cool high-voltage circuit section 75, and water jacket 74 serves to thermally insulate motor generator MG2 and PCU 21 from each other.

Figure 5:
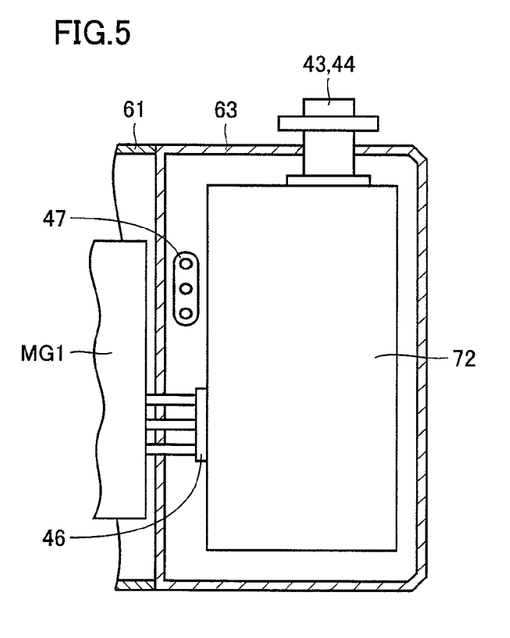
FIG. 5 is a sectional view showing various terminals provided for the PCU shown in FIG. 4.
Figure 6:
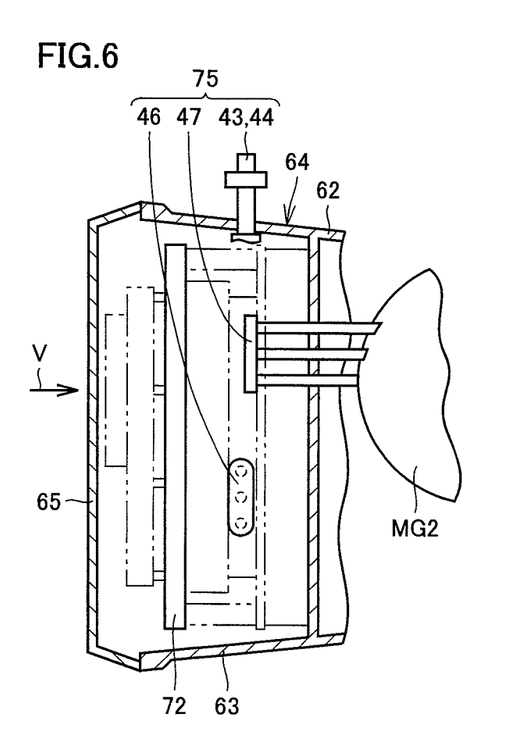
FIG. 6 is a sectional view showing various terminals provided for the PCU shown in FIG. 4.

FIGS. 5 and 6 are sectional views showing various terminals provided for the PCU shown in FIG. 4. FIG. 6 corresponds to FIG. 4, and FIG. 5 is a diagram viewed in the direction of an arrow V shown in FIG. 6. With reference to FIGS. 1, 5 and 6, high-voltage circuit section 75 includes DC terminals 43 and 44 for electrically connecting battery unit 40 and PCU 21, MG terminal 46 for electrically connecting motor generator MG1 and PCU 21, and MG terminal 47 for electrically connecting motor generator MG2 and PCU 21. DC terminals 43, 44, MG terminal 46 and MG terminal 47 are located at the rear side of the vehicle relative to cooling plate 72.

Assume the case where the hybrid vehicle crashes. In this case, shock imposed at the front side of the vehicle will be transmitted to engine compartment 51. According to the present embodiment, low-voltage circuit section 71, cooling plate 72 and high-voltage circuit section 75 are arranged in the cited order from the front side to the rear side of the vehicle. Such configuration allows the shock to be absorbed initially by low-voltage circuit section 71, and improves the strength of high-voltage circuit section 75 at the front side of the vehicle by the presence of cooling plate 72.

In the present embodiment, cooling plate 72 is fixed to MG2/inverter case 64 serving as a case body storing motor generator MG2. Accordingly, cooling plate 72 is provided as a firmly-supported rigid body, allowing the strength of high-voltage circuit section 75 at the front side of the vehicle to be significantly improved. In addition, cooling plate 72 is located at the rear side of the vehicle relative to opening plane 63*p* of MG2/inverter case 64. Such configuration allows the circumference of high-voltage circuit section 75 to be surrounded by cooling plate 72 and tubular portion 63 of MG2/inverter case 64. Since the shock imposed at the front side of the vehicle reaches the leading edge of tubular portion 63 before reaching cooling plate 72, the shock can be absorbed through deformation of tubular portion 63. Moreover, cooling plate 72 is located at the rear side of the vehicle relative to leading edge 61*f* of MG1 case 61. This similarly allows the shock to be absorbed through deformation of MG1 case 61.

Vehicle drive device 20 according to the present embodiment of the invention includes motor generators MG1 and MG2 serving as rotating electric machines generating drive force, and power control unit (PCU) 21 integrated with motor generators MG1 and MG2 for controlling motor generators MG1 and MG2. PCU 21 includes low-voltage circuit section 71 to which a relatively low voltage is applied, high-voltage circuit section 75 which is located at the rear side of the vehicle relative to low-voltage circuit section 71 and to which a relatively high voltage is applied, and cooling plate 72 located between low-voltage circuit section 71 and high-voltage circuit section 75 in the longitudinal direction of the vehicle for cooling high-voltage circuit section 75.

In the event of a crash of the hybrid vehicle, vehicle drive device 20 according to the present embodiment of the invention having the aforementioned configuration can reduce shock reaching high-voltage circuit section 75 to which a high voltage is applied. This allows appropriate protection of PCU 21.

In the present embodiment, the present invention has been applied to, but not limited to, a hybrid vehicle employing an internal combustion engine and a battery as driving sources. The present invention is also applicable to a fuel cell hybrid vehicle (FCHV) employing a fuel cell and a battery as driving sources, or to an electric vehicle (EV). In the hybrid vehicle of the present embodiment, an internal combustion engine is driven at an operating point of optimum fuel efficiency, whereas, in the FCHV, a fuel cell is driven at an operating point of optimum electric power generation efficiency. A battery is used in both hybrid vehicles in basically the same manner.

It should be construed that embodiments disclosed herein are by way of illustration in all respects, not by way of limitation. It is intended that the scope of the present invention is defined by claims, not by the description above, and includes all modifications equivalent in meaning and scope to the claims.

INDUSTRIAL APPLICABILITY

The present invention is mainly applied to a hybrid vehicle employing, as driving sources, an internal combustion engine such as a gasoline engine or a diesel engine, and a motor supplied with electric power from a chargeable and dischargeable secondary battery, a fuel cell hybrid vehicle employing a fuel cell and a battery as driving sources, an electric vehicle, and the like.

The invention claimed is:

1. A drive device for a vehicle comprising:
a rotating electric machine generating drive force; and
a power control unit provided integrally with said rotating electric machine for controlling said rotating electric machine,
said power control unit including
a low-voltage circuit section to which a relatively low voltage is applied,
a high-voltage circuit section which is located at a rear side of the vehicle relative to said low-voltage circuit section and to which a relatively high voltage is applied, and
a cooling plate located between said low-voltage circuit section and said high-voltage circuit section in a longitudinal direction of the vehicle for cooling said high-voltage circuit section,
wherein said high-voltage circuit section includes an inverter converting between a DC voltage and an AC voltage between said rotating electric machine and a battery, and a converter boosting and down-converting a voltage, the converter including a smoothing capacitor smoothing the voltage after being boosted, and
said low-voltage circuit section includes a controller sending control signals to said inverter and said converter.

2. The drive device for a vehicle according to claim 1, further comprising a case body storing said rotating electric machine, wherein
said cooling plate is made of metal and fixed to said case body.

3. The drive device for a vehicle according to claim 1, further comprising a case body storing said rotating electric machine and being made of metal, wherein
said case body includes a tubular portion having a tubular shape extending in the longitudinal direction of the vehicle, and storing said power control unit in the tubular shape, and
said cooling plate and said high-voltage circuit section are located at the rear side of the vehicle relative to an opening plane where said tubular portion is open toward a front side of the vehicle.

4. The drive device for a vehicle according to claim 1, wherein
a first rotating electric machine and a second rotating electric machine controlled by said power control unit to execute different operations are provided as said rotating electric machine,
said first rotating electric machine and said second rotating electric machine are located such that a rotation axis of said second rotating electric machine is offset to the rear side of the vehicle relative to a rotation axis of said first rotating electric machine, and
said power control unit is located at a front side of the vehicle relative to said second rotating electric machine.

5. The drive device for a vehicle according to claim 4, further comprising:
a first case body storing said first rotating electric machine; and
a second case body storing said second rotating electric machine and said power control unit, said second case body being arranged adjacent to said first case body in a lateral direction of the vehicle, and coupled to said first case body, wherein
said cooling plate and said high-voltage circuit section are located at the rear side of the vehicle relative to a leading edge of said first case body in the longitudinal direction of the vehicle.

6. The drive device for a vehicle according to claim 1, wherein said rotating electric machine and said power control unit are placed in an engine compartment located at a front side of the vehicle.

* * * * *